US006393600B1

(12) United States Patent
Sribhashyam et al.

(10) Patent No.: US 6,393,600 B1
(45) Date of Patent: May 21, 2002

(54) SKEW-INDEPENDENT MEMORY ARCHITECTURE

(75) Inventors: Sarathy Sribhashyam, Sunnyvale; David Hoff; Nalini Ranjan, both of San Jose, all of CA (US)

(73) Assignee: S3 Incorporated, Santa Clara, CA (US)

( * ) Notice: Subject to any disclaimer, the term of this patent is extended or adjusted under 35 U.S.C. 154(b) by 0 days.

(21) Appl. No.: 09/320,191

(22) Filed: May 26, 1999

(51) Int. Cl.$^7$ .............................. G06F 17/50; G11C 8/00
(52) U.S. Cl. ................. 716/1; 716/7; 365/233; 365/189.05
(58) Field of Search ................ 716/1, 7; 365/233, 365/189.05, 230.06

(56) References Cited

U.S. PATENT DOCUMENTS 5,712,818 A * 1/1998 Lee et al. ............... 365/185.21
5,893,925 A * 4/1999 Sawada ...................... 711/167

* cited by examiner

Primary Examiner—Huan Hoang

(74) Attorney, Agent, or Firm—Christie, Parker & Hale, LLP

(57) ABSTRACT

A word line block, a data block and at least one memory cell form a memory architecture and impose no special timing requirements to handle the synchronization of the outputs of the word line block with the data block. Further, the word line block contains a transmitting transistor and the data block contains a functionally similar transmitting transistor. These transmitting transistors responsive to a write enable signal and a clock signal synchronize a selection signal supplied to the memory cell when data is also supplied to the memory cell. Furthermore, a place in route tool can automatically place and route the word line block, the data block and the at least one memory cell based on chip requirements. Also, with the clock signal proximate the output of the word line block and data block, the place and route tool is able to automatically place and route the blocks and the at least one memory cell to compensate for any calculated interconnection delays. Moreover, since the word line block, the data block, and the at least one memory cell are separate blocks, flexibility is provided in the placement of the blocks as each block requires a reduced amount of layout space as compared to all three blocks together. Also provided is a process using synthesis method for creating a digital electronic circuit with the memory architecture including the word line block, the data block, and the at least one memory cell.

15 Claims, 5 Drawing Sheets

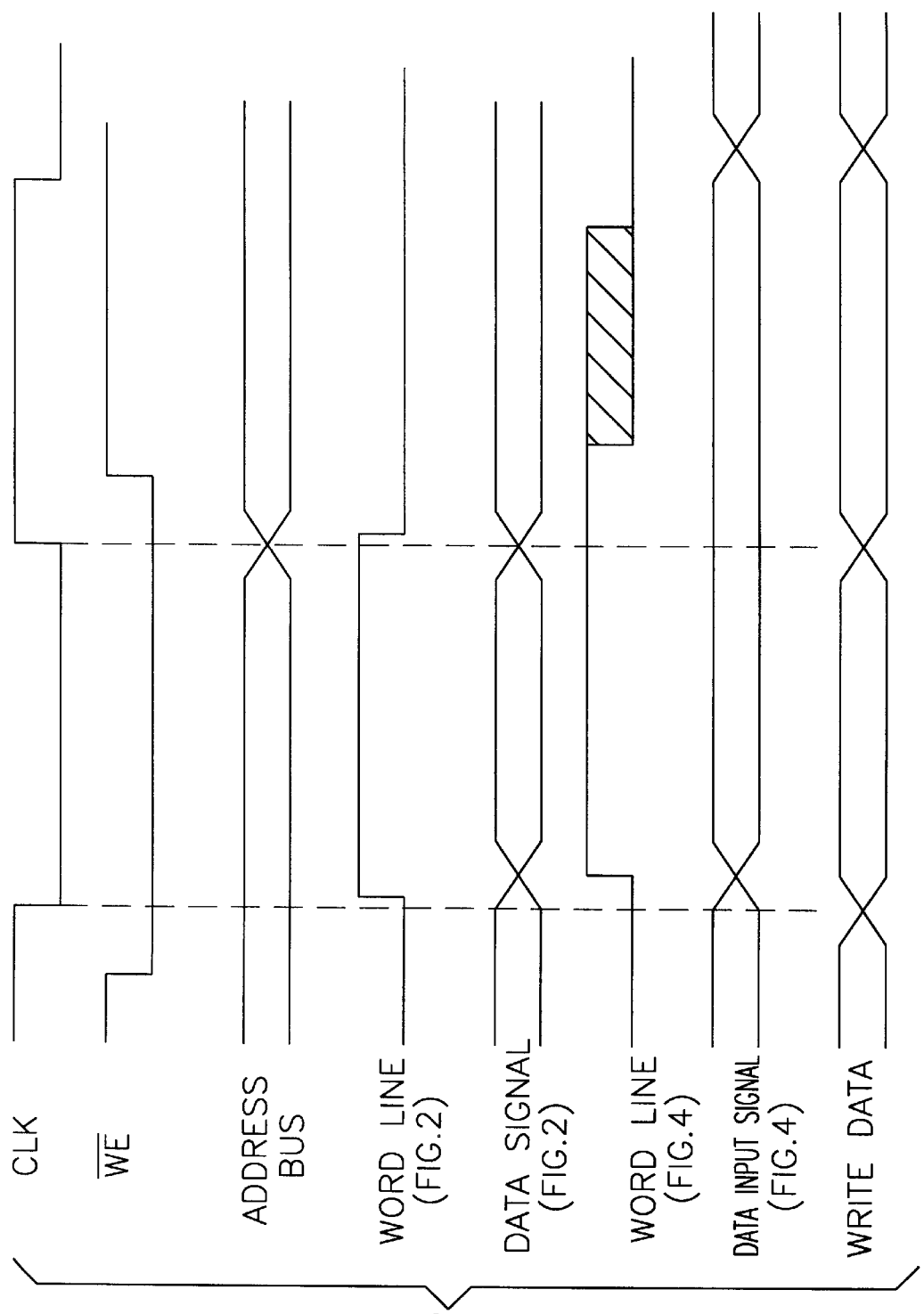

SKEW-INDEPENDENT MEMORY ARCHITECTURE

BACKGROUND OF THE INVENTION

This invention relates generally to the design of integrated circuits and the design thereof, and more particularly to a memory architecture and synthesis method using the memory architecture.

The use of integrated circuits is widespread and pervasive. Integrated circuits have a variety of uses, and are found in a variety of devices. Such integrated circuits often require temporary storage of information. Temporary storage of information allows integrated circuits to not only respond to immediate conditions, but to do so in view of past activities. The temporary storage of information is often accomplished using memory cells, and many integrated circuits include a large number of memory cells. In order to store information a particular memory cell must be specified for storage of the information, and the information must be provided to the memory cell. Thus, storage of information, or data, in a memory element, or cell, generally requires two separate signals. One signal, a selection signal, selects a particular memory element for storage of information, and another signal, a data signal, provides the information for storage in the particular memory element.

Further, the selection signal and the data signal used in storing data in a memory cell require a high degree of synchronization. Absent such synchronization, the particular memory cell may receive data intended for another memory cell, or the data intended for storage in the particular memory cell may, in fact, be stored in some other memory cell. The necessary degree of synchronization of the selection signal and the data signal is determined by a time period, a synchronization window, in which the selection signal and the data signal must both be valid with respect to each other. In general the synchronization window, that is the permissible variation in the timing of the selection and data signals, is determined by the clock period of a clock signal used within the integrated circuit, the clock skew between any two points within the integrated circuit, any signal skew in providing the signals, and any applicable circuit element set-up and hold times. When the clock period is relatively long, the various skews and set-up and hold times are somewhat irrelevant. As the clock period decreases, however, the synchronization requirement becomes more exacting and variations introduced, for example, by data signal and clock signal travel paths, may introduce skews of importance.

For many modern integrated circuits, which operate at high clock speeds, the clock period is sufficiently short that clock skew and signal skew may affect synchronization of the selection and data signals. Accordingly, great care must be taken in the placement of memory elements and the routing of data and clock signals to ensure sufficient synchronization of signals. Absent great care in the placement of circuitry for generating selection signals and placement of circuitry for generating data signals, operation of the integrated circuit as a whole may be faulty.

In addition, layout space in modern integrated circuits is often at a premium as integrated circuits are performing ever increasing tasks and have ever increasing capabilities without commensurate increases in chip size. Thus, placement of circuitry associated with memory elements must also be done with a view to minimizing layout space of the integrated circuit as a whole, which can be a difficult task due to the numerous elements which make up the integrated circuit.

Preferably, placement of circuitry associated with memory elements would be performed automatically by tools, such as place and route tools. Place and route tools automatically arrange and interconnect logic cells on a chip, based on the size of the logic cells, the footprint of the chip, timing requirements provided by the designers, and other criteria. Place and route tools, however, do have limitations. For example, place and route tools often are unable to tightly pack components, and place and route tools often require that signals upon which timing criteria are based be proximately tied to a clock signal. The circuitry generating the selection signal and the data signal, however, must be tightly packed to meet timing requirements, and the signals, particularly the data signal, are often not proximately tied to a clock signal. Thus, place and route tools are often unable to accurately determine placement requirements of circuitry associated with generating selection and data signals as entities separate from the memory element.

Accordingly, laborious and exacting "hard-placement," i.e., explicit selection of location of memory elements and associated circuitry within the integrated circuit, is required to be performed by the designer. In other words, the designer hand places the memory element, the circuit elements generating the selection signal, and the circuit elements generating the data signal with respect to each other in a tightly packed manner. Together these tightly packed elements form a specially handled block. FIG. 1 illustrates a block diagram of a specially handled block, with a specially handled block 10 responsive to a write enable signal 11, a clock signal 12, an address bus 13, and a write data signal 14.

The specially handled block 10 includes circuitry corresponding to that of FIG. 2. FIG. 2 illustrates circuitry for providing temporary storage of information, i.e., a memory architecture. A memory cell 37 is used to store information. More than one memory cell may be present, but for clarity only one memory cell is shown. The memory cell is selected using a word line signal 52, and receives data via a data signal 58. The word line signal is generated using a write enable signal, a clock signal, and an address bus. The write enable signal indicates that a write operation, opposed to a read operation, is to occur. The clock signal provides a timing reference for circuit operation. The address bus provides information as to which particular memory cell is subject to the operation. As the write is to occur when both the clock signal and the write enable signal are low, the write enable signal and the clock signal are provided to a two input NOR gate 31. The output of the NOR gate 31 supplies a first input to an AND gate 35. A second input to the AND gate 35 is an address selected signal that is produced by an address decoder 33. The address decoder responds to input of address information from the address bus. Thus, the second input to the NOR gate indicates selection of the memory cell for an operation. The AND gate 35 produces the word line signal for the memory cell. The second input into the memory cell 37 is the data signal. The data signal is formed by a buffer 39. The buffer 39 receives a write data signal as its input. In FIG. 2, the storing of the data signal in the memory cell 37 is accomplished using the buffer 39. The selection of the memory cell 37 is accomplished by the NOR gate 31, AND gate 35 and the address decoder 33.

The use of hand-placed specially handled blocks, such as the specially handled block of FIG. 1, presents several problems, however. Place and route tools must still connect the specially handled blocks to other components, and such connections may result in chip area wastage as the place and route tool is unable to locate the hand-placed specially handled block and the connections to the specially handled block in an optimum manner. More importantly, as chip complexity increases so does the number of specially handled blocks. Large numbers of specially handled blocks simply cannot be manually placed in an economic or efficient manner. Even more importantly, specially handled blocks are, by their very nature, adapted for use with a specific process technology, such as a 0.25 micron or 0.18 micron technology. The delay calculations, space requirements,. power requirements, and other considerations for components making up the specially handled block are determined with respect to a specific technology, and those considerations may not hold for other technologies. Thus, the specially handled blocks are not technology independent. Accordingly, whenever chip technology changes the designs of the specially handled blocks must also change.

SUMMARY OF THE INVENTION

The present invention provides a memory architecture with three separate units, a word line block, a data block and at least one memory cell. The word line block is responsive to a write enable signal, a clock signal and an address bus. The word line block forms a selection signal which is applied to at least one memory cell for selecting the at least one memory cell for data storage. The word line block from the combination of the write enable signal, the clock signal and an address signal, derived from an address decoder coupled to the address bus, forms the selection signal.

In one embodiment the word line block comprises means for decoding an address signal from an address bus, means for determining when the write operation is asserted, and means for forming a word line signal. The means for forming word line signal acts in response to a write signal generated by the means for determining when a write operation is asserted and an address signal generated by the means for decoding an address signal. In addition, in one embodiment the word line block further comprises a means for gating the word line signal. Further, in one embodiment the data block comprises means for forming a data signal and additional means for determining when the write operation is asserted, and means for gating the data signal.

Circuit designers often specify elements from libraries containing cells specifying physical and electrical characteristics of such cells. Accordingly, in one embodiment the memory architecture comprises a memory cell mapped into a representative memory cell specifying physical and electrical characteristics of the cell, a word line block mapped into a representative word line block cell, and a data block mapped into a representative data block cell.

The present invention also provides a process using a synthesis method for designing a memory architecture described above. In such a process, a circuit designer designs a digital logic circuit that stores and retrieves data, essentially a memory architecture. A hardware description language (HDL) is used to design the circuit operation. Generated from the HDL is a list of logic components and interconnections between the logic components. The list of components are mapped to cells which include the word line block, the data block, and at least one memory cell with each cell specifying actual electronic circuit elements. A place and route tool automatically places and routes the cells to form the memory architecture.

Many of the attendant features of this invention will be more readily appreciated as the same becomes better understood by reference to the following detailed description and considered in connection with the accompanying drawings in which like reference symbols designate like parts throughout.

BRIEF DESCRIPTION OF THE DRAWINGS

FIG. 6 illustrates a timing diagram of signals of the memory architectures of FIGS. 2 and 4.

DETAILED DESCRIPTION

Figure 4:
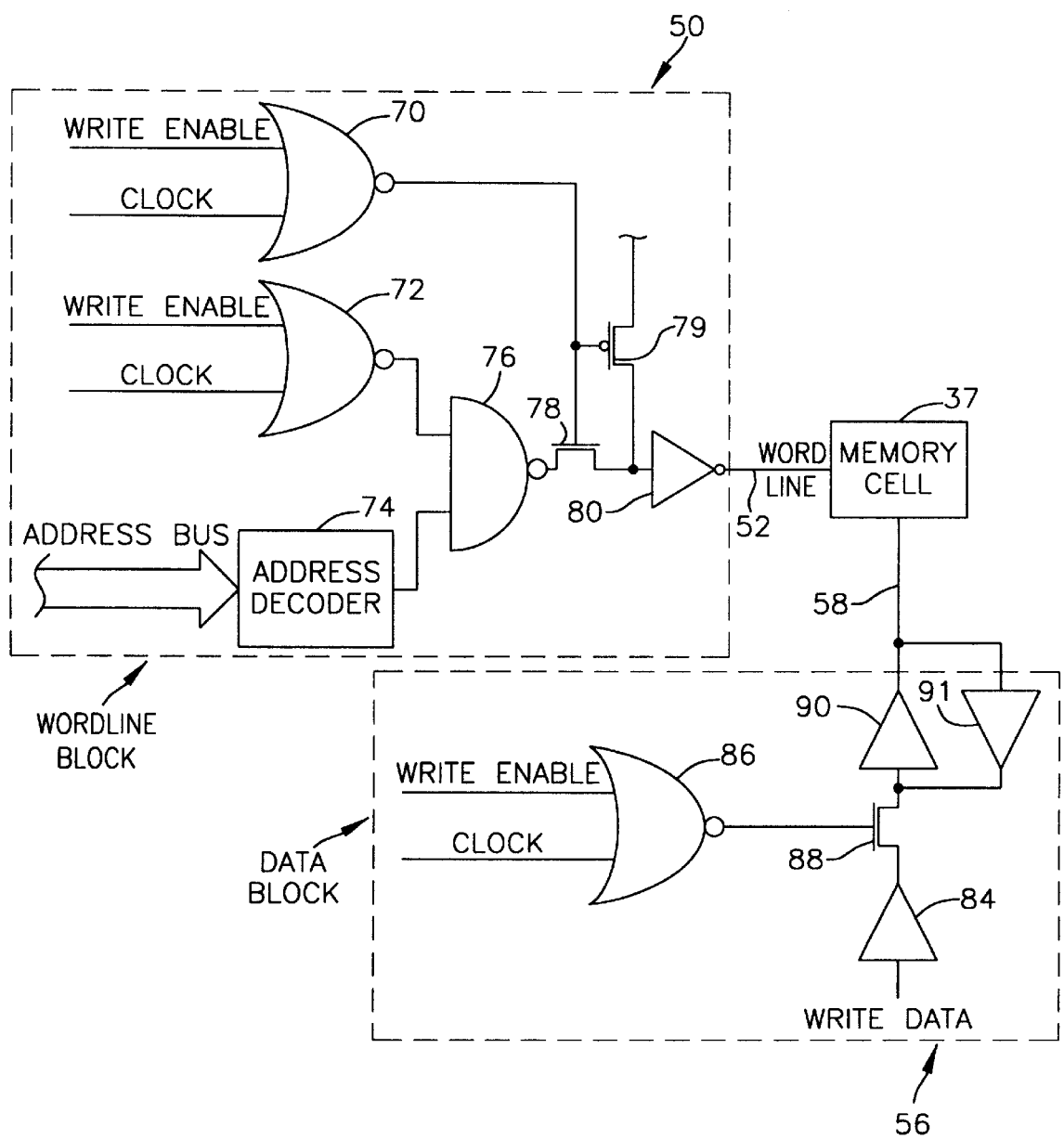
FIG. 4 illustrates a block diagram of a memory architecture of the present invention.

FIG. 4 illustrates a semi-schematic of a memory architecture of the present invention. The memory architecture includes a word line block 50, a data block 56, and a memory cell 37. The word line block generates a selection signal, namely a word line signal. The data block generates a data in signal. The memory cell stores information, namely the value of the data in signal, when the word line is active.

A write operation is asserted when the write enable signal and the clock signal are low. The address information provided by the address bus indicates whether a particular memory cell is subject to the write operation. Accordingly, the word line block of FIG. 4 determines, as does the memory architecture of FIG. 2, whether a memory cell is selected using a write enable signal, a clock signal, and an address bus. Unlike the memory architecture of FIG. 2, the word line block of FIG. 4 additionally includes circuitry for providing additional control over the selection signal provided the memory call.

More specifically, the word line block determines when a memory cell 37 is selected using a NOR gate 72, an address decoder 74, and a NAND gate 76. The write enable signal is provided to the NOR gate 72, which has two inputs. The second input to the NOR gate 72 is the clock signal. When both the write enable signal and the clock signal are low i write operation is to occur. Thus, the NOR gate 72 produces a write ready signal, which is provided to a NAND gate 76. The NAND gate 76 also is provided an address signal. The address signal indicates whether the memory element 37 is selected. The address signal is formed by an address decoder. The address decoder examines an address bus and determines if the address bus indicates that the memory element 37 associated with the memory architecture is selected. If the memory element is selected the address decoder generates an address signal, which is provided to the NAND gate 76. Accordingly, the output of NAND gate 76 is low when a write operation is to occur with respect to the memory element 37.

Inversion of the output of NAND gate 76 to provide a word line signal to the memory cell is not, however, immediately performed. Instead the output of the NAND gate is first passed through a transmission gate formed by a transistor 78, with the transmission gate controlled using the output of a second NOR gate 70. Thus, the output of the NAND gate 76 provides an input to the drain of the transistor 78. Supplied to the gate of the transistor 78 is a transmit input that is produced from the second NOR gate 70. The second NOR gate 70 receives as inputs the write enable signal and the clock signal, and therefore provides a write ready signal similar to the write ready signal provided by NAND gate 72. The source of the transistor 78 is connected to an inverter 80. The output of the inverter 80 forms the word line signal which is provided to the memory cell. Accordingly, the transistor 78 gates the precursor to the word line signal, and does so independent of the address decoder. As the clock signal is one gate away from the transistor, and the gate inputs are not subject to complex logic, automatic tools are generally able to determine timing relationships with respect to generation of the word line signal.

Also connected to the source of the transmitting transistor 78, and therefore the input of the inverter 80, is a pull-up PMOS transistor 79. The source of the PMOS transistor 79 is connected to a high voltage. The drain of the PMOS transistor 79 is connected to the source of the transistor 78. The transmit input signal is provided to the gate of the PMOS transistor.

The transistor 78 is only active if the input at the gate of the transistor 78 is a logic 1 or high. Conversely, the PMOS transistor 79, whose gate has the same input as the gate of the transmitting transistor 78, is only active when the input at its gate is low. Therefore, when the transistor 78 is active, a signal at the drain of the transistor 78 is passed to the source of the transmitting transistor 78 and thus, provided to the inverter 80. If the transistor 78 is inactive, which is when the input at the gate of the transistor 78 is a logic 0 or low, the PMOS transistor 79 is active and causes the input to the inverter to go high.

Returning now to the data block 56, the data block generates a data signal for storage in the memory cell. The data signal is formed by gating a write data signal. The gate is formed using a transistor 88, which is controlled by a control signal formed using the write enable and clock signals. This is done in a manner similar to the gating of the word line signal accomplished in the word line block, and provides similar benefits. More specifically, the write enable signal and the clock signal are provided to a NOR gate 86. The output of the NOR gate 86 provides a data transmit input into the gate of the transistor 88. The drain of the transistor 88 is connected to the output of a buffer 84. The buffer 84 receives a write data signal as its input. The source of the transistor 88 provides a data input to a latch formed by a buffer 90 and a buffer 91. As a result, the latch formed provides a data input signal 58 to the memory cell 37.

The transistor 88 of the data block 56 is active only when the input to the gate of the transistor 88 is a logic 1. This occurs when the write enable signal and the clock signal are both logic 0. When both the write enable and the clock signals are a logic 0, the write data signal supplied to the buffer 84 passes from the buffer 84 and through the transmitting transistor 88 to the latch. As a result, the latch supplies the data signal 58 to the memory cell 37. When the write enable signal and the clock signal are in any other combination of logic states, the transmitting transistor 88 of the data block 56 will be inactive. When the transistor 88 is inactive, the latch maintains the prior value of the write data signal.

Accordingly, generation of the data signal is, like generation of the word selection signal, tied to a clock signal such that automatic tools are capable of determining timing relationships with respect to generation of the data signal. Moreover, in the embodiment presently described, similar logic structures are used to gate both the word line and data signals, and these structures are similarly placed in the signal paths leading to generation of the word line and data signals. Therefore, by making the outputs of the data block 56 and the word line block 50 dependent and proximate to the transistors 88 and 78, respectively, a place and route tool can automatically place and route signals with respect to the memory cell 37, the word line block 50, and the data block 56. Further, this can be accomplished in view of layout requirements of the circuit as a whole without necessarily requiring intervention by the designer.

Figure 2:
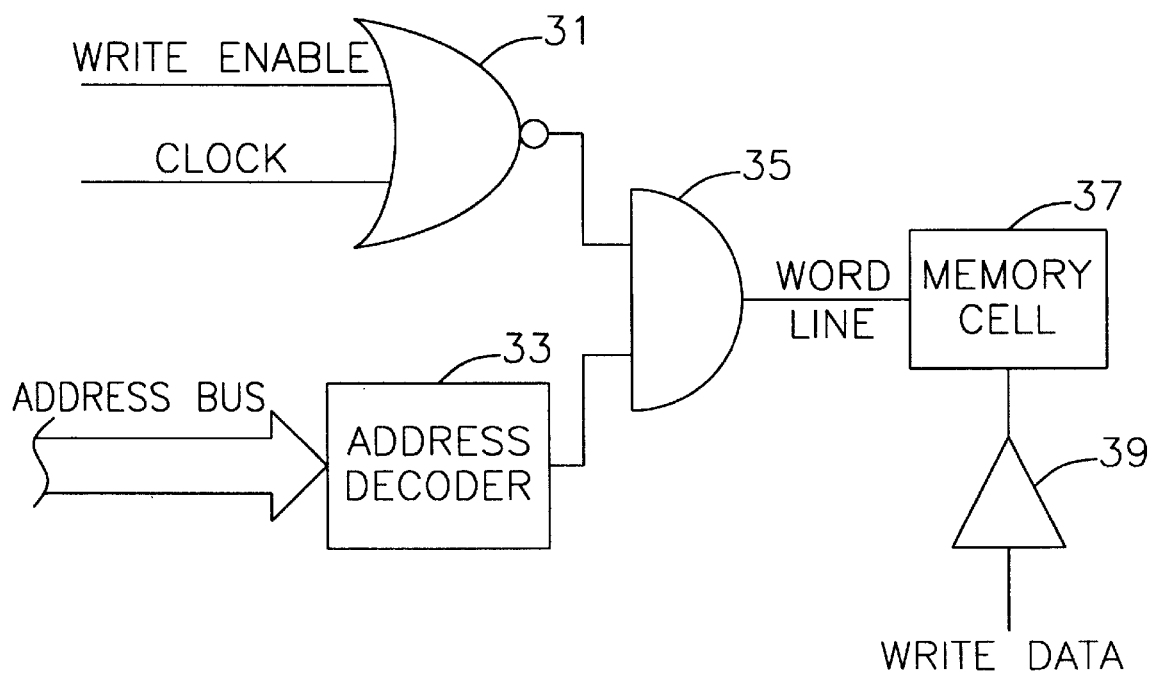
FIG. 2 illustrates a detailed view of the conventional memory architecture of FIG. 1.
Figure 3:
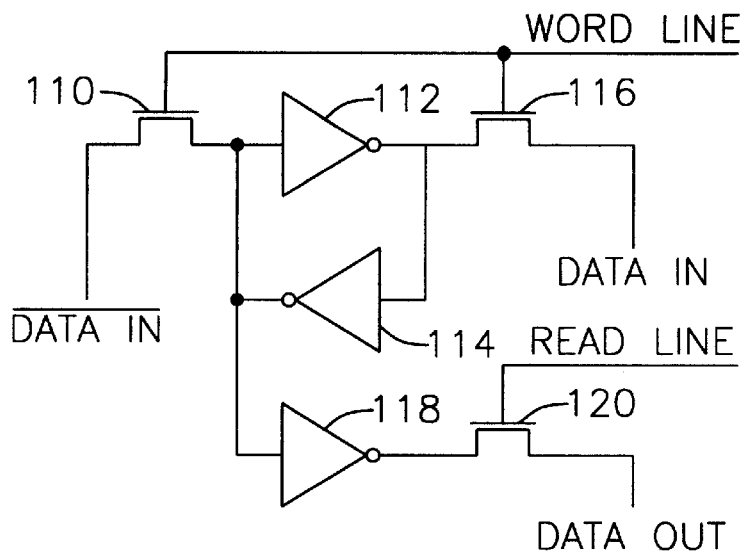
FIG. 3 shows a detailed view of a conventional implementation of a memory cell.

For completeness, FIG. 3 illustrates a detailed view of circuitry comprising the memory element 37 of FIG. 2. An inverted data in signal, i.e. a $\overline{\text{bit line}}$ signal, is provided to the drain of a transfer transistor 110. The gate of the transfer transistor 110 is connected to a word line. The source of the transfer transistor 110 supplies the input to the inverter 112. The output of the inverter 112 is fed to the drain of the transfer transistor 116 and into the inverter 114. The gate of the transfer transistor 116 is connected to the word line and the source of the transistor 116 is supplied a data in, i.e. a bit line signal. As previously described, the source of the transfer transistor 116 is connected to the output of the inverter 112 and the input of the inverter 114. The output of the inverter 114 is fed back into the inverter 112 and also supplies input into an inverter 118. The output of the inverter 118 feeds the source of the transfer transistor 120. The gate of the transfer transistor 120 is connected to a read line and the drain of the transfer transistor 120 supplies a data out signal.

For a write operation, the storing of data in a memory cell, an active word line activates the transfer transistors 110 and 116. As a result, data from the data in signal is passed into the memory cell. In a read operation, the retrieving of data from the memory cell, an active read line activates the transfer transistor 120 to allow data stored in the memory cell to exit and form the data out signal. The read operation is essentially identical to the write operation, except data is retrieved from the memory cell instead of stored in the memory cell.

As may be seen with respect to FIG. 3, data is stored by a latch formed by invertors 112 and 114 when the word line is active. More specifically, shortly after the word line goes high, the data in signal is presented to the latch. The latch then stores the value of the data in signal, after any applicable set-up and hold time required by the circuitry forming the latch. If the data in signal changes to a new value while the word line is high, the new value will be stored by the latch, assuming that the word line does not go low during the setup or hold time of the latch (in which case the latch may or may not store the new value).

In view of the foregoing, the embodiment of FIG. 4 may include refinements to further improve the timing characteristics of the memory architecture. These refinements may be more fully understood when discussed in connection with the timing diagram illustrated in FIG. 6, which pertains to both the circuits of FIG. 2 and FIG. 4. The timing diagram of FIG. 6 illustrates signals of both the circuits of FIG. 2 and FIG. 4 when subjected to defined input signals. The input signals are a clock (CLK) signal, a write enable signal, and an address bus. As previously stated, the word line signal is set high when the address bus indicates that the particular memory cell connected to the word line selected and the clock and write enable signals are both low. Accordingly, when both the clock signal and the write enable signal are low, and assuming the address bus indicates the particular memory cell selected, the word line signal for FIG. 2 goes high. If the circuit of FIG. 4 is simultaneously subject to the same input signals, the word line signal of FIG. 4 also goes high, albeit slightly delayed with respect to that of FIG. 4 due to the presence of the transistor 78 and inverter 80.

The word line signal of the circuit of FIG. 2 remains high until the clock (CLK) signal transitions to the high state. The write data signal, however, also changes on the rising clock edge. In the circuit of FIG. 4, however, the write data signal only changes when both the write enable signal and the clock signal are low. This is due to the effect of the latch formed by buffers 90 and 91. Thus, in the circuit of FIG. 2, the data in signal must be valid at a time prior to the clock signal going high. In the circuit of FIG. 4, however, the data in signal is held constant by the latch 56 until a subsequent falling edge of the clock (CLK) signal. Thus, for the circuit of FIG. 4 maintaining the word line signal in a high state for some time after the rising edge of the clock signal increases the timing window for writing data to the memory cell.

The time at which the word line signal goes low depends on the strength of the PMOS transistor 79 of FIG. 4. If the PMOS transistor 79 of FIG. 4 is a relatively weak transistor the input to the inverter will be pulled high at a relatively slow rate, thereby delaying the time at which the word line signal goes low. This allows tuning of the timing window. The potential for tuning, or modifying, the timing window by changing the time at which the word line signal goes low is indicated graphically in FIG. 6 by the cross-hatched area of the word line signal of FIG. 4. Care must also be taken, however, that the transistor 78 does not drive the input to the inverter 80 high due to a high signal being applied to the drain of the transistor 78 prior to the transistor 78 turning off. Therefore, the PMOS transistor 79 of FIG. 4 is made a weak PMOS transistor and the NOR gate 72 is constructed so as to have a slow fall time as compared to the NOR gate 70. In an alternative embodiment, delay elements such as buffers, delay the inputs to the NOR gate 72 to avoid a race condition with respect to the signals provided to the transistor 78.

Thus, when the clock signal goes high, the output of the NOR gate 70 goes low relatively quickly, turning off the transistor 78 and turning on the PMOS transistor. The PMOS transistor thereafter raises the input to the inverter 80 to a high state, and causes the word line to go low, but does so at a relatively slow rate due to the low strength of the PMOS transistor, thereby maintaining the word line signal in a high state for a short period after the rising edge of the clock signal. In addition, the NOR gate 86 of the data block is also constructed so as to have a fast fall time so that potential changes in the write data signal on the rising clock edge do not get passed to the latch formed by buffers 90 and 91.

Figure 5:
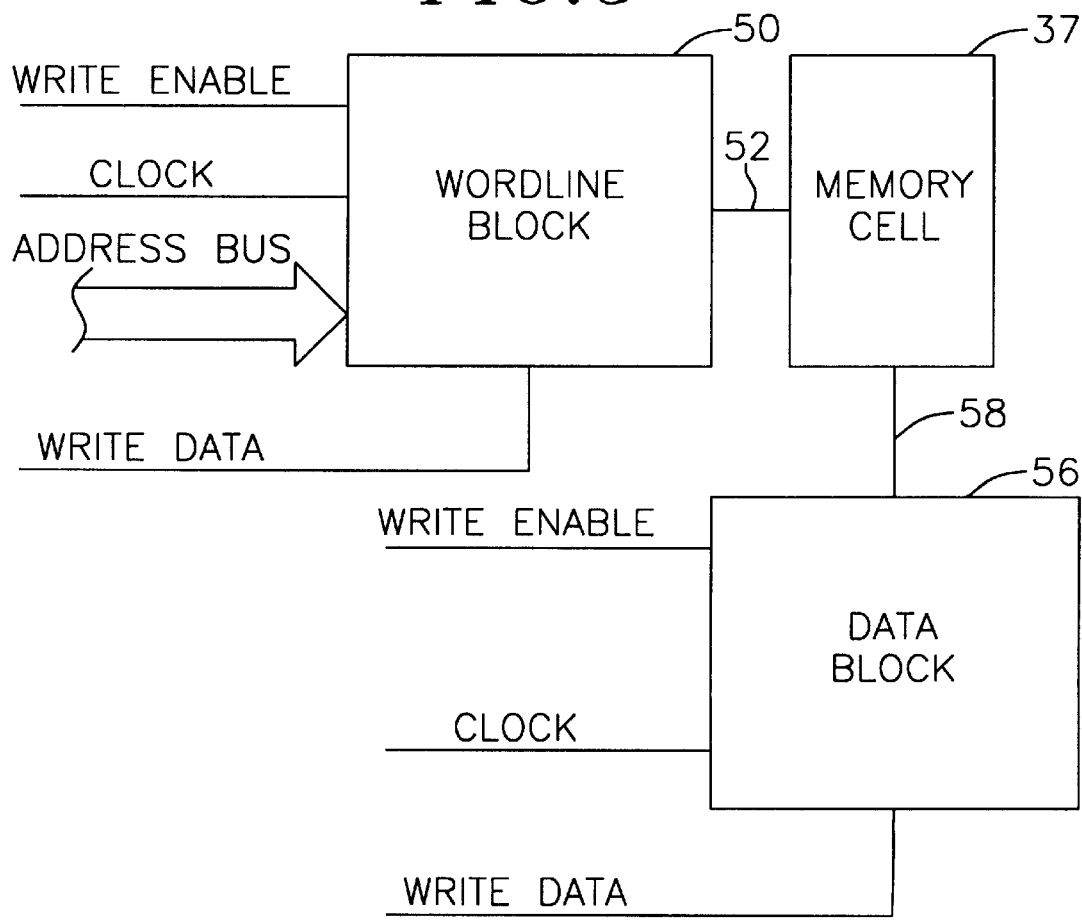
FIG. 5 illustrates a block diagram of the memory architecture of FIG. 4.

FIG. 5 illustrates a block diagram of the memory architecture of the present invention. The memory architecture uses three separate functional units. The word line block 50 has three inputs, a write enable signal, a clock signal and address information on an address bus. The word line block 50 processes the address information, the clock signal and the write enable signal to produce a selection input 52. The selection input 52 is supplied to the memory cell 37. More than one memory cell may be present in the memory architecture, but, for clarity, only one memory cell is shown. The selection input 52 chooses at least one memory cell in which data will be stored. A data signal 58 is also fed into the memory cell 37. The data signal 58 is produced by the data block 56. The data block 56 has three inputs, a write enable signal, a clock signal and a write data signal. The data block 56 processes the three input signals to produce the data signal 58 that is fed into the memory cell 37.

Also, as previously discussed, a place and route tool automatically arranges logic cells on a chip, based on requirements of the chip. The cells in the present invention are the word line block, the data block, and the memory cell. Unlike the memory block 10 of the conventional memory architecture illustrated in FIG. 1, the word line block, the data block, and the memory cell impose minimal timing requirements to handle synchronization of the select and transport operations. Therefore, place and route tools are able to automatically place the cells based on the chip requirements.

Figure 1:
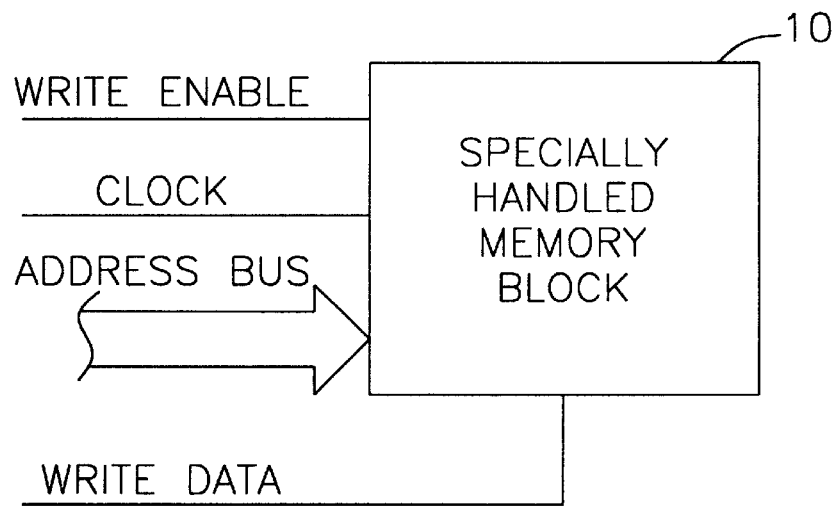
FIG. 1 illustrates a block diagram of a conventional memory architecture.

Furthermore, unlike the memory block 10 of FIG. 1, the word line block, the data block, and the memory cell are each relatively small in size. Therefore these blocks may more easily fit in with the rest of the logic elements in the integrated circuit, thereby avoiding wastage due both to block size irregularity and routing problems associated with large blocks.

Additionally, circuit designers use cell libraries, sometimes indirectly, to construct circuits, with each cell in the cell library representing a circuit element. Generally speaking, circuit designers specify circuit operation by using a high level language description such as a hardware description language (HDL), of which Verilog HDL is an example. The HDL is generally provided to a compiler which creates a net list containing the specific logic components of the circuit and the connections between the components that comprise the circuit. The compiler then utilizes the net list to map specific cells from the cell library to each of the components. The cells specify actual circuit elements. Placement of the word line block 50 and data block 56 as cells in the cell libraries allows the circuit designer to select the blocks with the knowledge that minimal or negligible timing and space constraints will be placed on the designer. Furthermore, the place and route tool automatically places the blocks and routes signals via wires between the blocks.

Figure 7:
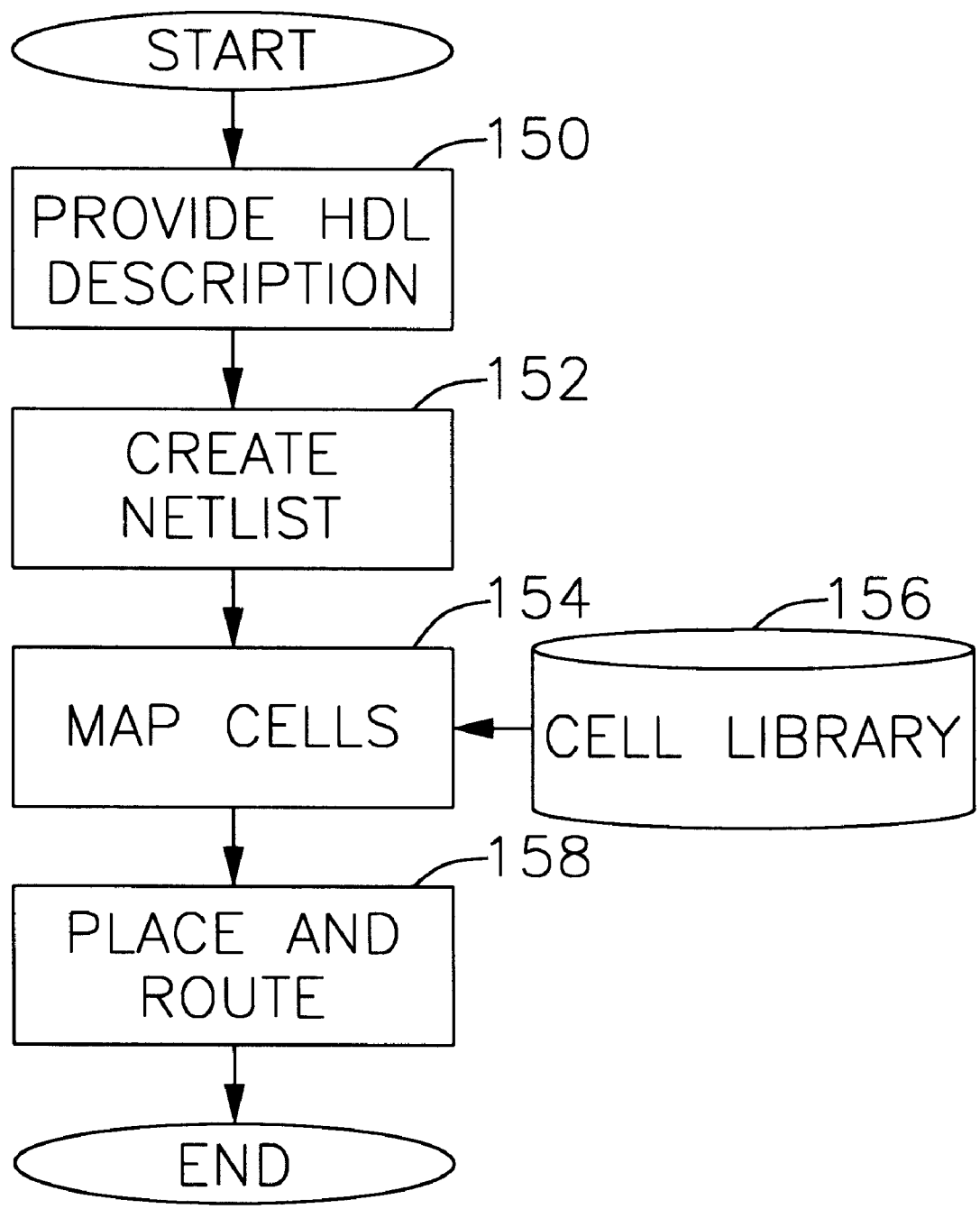
FIG. 7 illustrates a process of creating a digital electronic circuit with a memory architecture of the present invention using a synthesis method.

A flow diagram of a method of a process using the memory architecture of the present invention is illustrated in FIG. 7. A circuit designer provides a HDL description to a HDL compiler in Step 150. HDL compilers are well known and are available from companies such as Synopsys, Inc. In Step 152, the HDL compiler generates a generic or unmapped net list. In step 154, the net list is passed to an optimization and mapping tool such as Design Compiler by Synopsys, Inc. which maps cells from a cell library 156 to logic components in the net list. The separable. manageable, and standard aspect of the word line block 50, the data block 56, and the memory cell 37 provides for easy creation of cells representing each unit for use in Step 154. In Step 158, the word line block 50, the data block 56, and the memory cell 37 are automatically placed to form the memory architecture. In some circuit design environments, Step 152, the creation of the net list, and Step 154, the mapping of the cells of the logic components, occur in a seamless process, but are described separately herein for the purposes of clarity. Furthermore, the implementing of the word line block 50 and data block 56 may also be performed during the creation of the net list. Step 152.

Accordingly, the present invention provides for a memory architecture with separate units, the word line block, the data block and the memory cell. A methodology is also presented which will reduce the need to manually and specially place and route the memory architecture. Also, the timing constraints on each unit is reduced by ensuring the synchronization of the output from the data block 56 with the output from the word line block 50. Although this invention has been described in certain specific embodiments, many additional modifications and variations, such as the use of different transistors for the transistors 78 and 88, would be apparent to those skilled in the art. It is therefore to be understood, that this invention may be practiced otherwise than specifically described. Thus, the present embodiments of the invention should be considered in all respects as illustrative and not restrictive, the scope of the invention to be indicated by the appended claims and the equivalents thereof rather than the foregoing description.

What is claimed is:

1. A memory architecture comprising:

at least one memory cell:

a word line block responsive to a write enable signal, a clock signal, and an address bus for applying a selection signal to the at least one memory cell, the word line block forming the selection signal to select the at least one memory cell for data storage from the combination of the write enable signal, the clock signal, and an address signal, the address signal being derived from an address decoder coupled to the address bus;

a data block responsive to the write enable signal, the clock signal, and a data line, the data block providing a data signal to the at least one memory cell in synchronization with the memory cell receiving the selection signal from the word line block.

2. The memory architecture of claim 1 wherein the word line block comprises:

means for decoding the address signal from the address bus to determine when the memory cell is selected;

means for determining when a write operation is asserted;

means for forming a word line signal when a write operation is asserted and the memory cell is selected; and means for gating the word line signal.

3. The memory architecture of claim 2 wherein the means for gating the word line signal gates in response to a write signal generated by the means for determining when the write operation is asserted.

4. A memory architecture comprising:

at least one memory cell;

a word line block responsive to a write enable signal, a clock signal, and an address bus for applying a selection signal to the at least one memory cell, the word line block forming the selection signal to select the at least one memory cell for data storage from the combination of the write enable signal, the clock signal, and an address signal, the address signal being derived from an address decoder coupled to the address bus;

a data block responsive to the write enable signal, the clock signal, and a data line, the data block providing a data signal to the at least one memory cell in synchronization with the memory cell receiving the selection signal from the word line block;

wherein the word line block comprises:

means for decoding the address signal from the address bus to determine when the memory cell is selected;

means for determining when a write operation is asserted;

means for forming a word line signal when the write operation is asserted and the memory cell is selected;

means for gating the word line signal;

wherein the means for gating the word line signal gates in response to a write signal generated by the means for determining when the write operation is asserted;

wherein the data block comprises:

means for forming the data signal;

additional means for determining when the write operation is asserted; and means for gating the data signal, the means for gating the data signal gates the data signal in response to an additional write signal generated by the additional means for determining when the write operation is asserted.

5. A memory architecture comprising:

at least one memory cell;

a word line block responsive to a write enable signal, a clock signal, and an address bus for applying a selection signal to the at least one memory cell, the word line block forming the selection signal to select the at least one memory cell for data storage from the combination of the write enable signal, the clock signal, and an address signal, the address signal being derived from an address decoder coupled to the address bus;

a data block responsive to the write enable signal, the clock signal, and a data line, the data block providing a data signal to the at least one memory cell in synchronization with the memory cell receiving the selection signal from the word line block;

wherein the word line block comprises:

an inverter providing the selection signal to the at least one memory cell and connected to the at least one memory cell;

a first transistor with a source terminal connected to an input terminal of the inverter;

a first NAND gate with a first NAND gate output connected to a drain terminal of the first transistor;

a first NOR gate responsive to the clock signal and the write enable signal and connected to the gate terminal of the first transistor;

an address decoder responsive to an address bus, whereby the address decoder selects the at least one memory cell for receiving data from the data block, the address decoder having an address decoder output which is an input to the first NAND gate; and a second NOR gate responsive to the clock signal and the write enable signal with a second NOR gate output, which is an input to the first NAND gate.

6. The memory architecture of claim 5 wherein the word line block further comprises a PMOS transistor with a gate terminal of the PMOS transistor connected to the gate terminal of the first transistor and a drain terminal of the PMOS transistor connected to the source terminal of the first transistor.

7. The memory architecture of claim 6 wherein the PMOS transistor is a weak transistor.

8. A memory architecture comprising:

at least one memory cell;

a word line block responsive to a write enable signal, a clock signal, and an address bus for applying a selection signal to the at least one memory cell, the word line block forming the selection signal to select the at least one memory cell for data storage from the combination of the write enable signal, the clock signal, and an address signal, the address signal being derived from an address decoder coupled to the address bus;

a data block responsive to the write enable signal, the clock signal, and a data line, the data block providing a data signal to the at least one memory cell in synchronization with the memory cell receiving the selection signal from the word line block;

wherein the data block comprises:

a first buffer providing the data signal to at least one memory cell;

a second transistor with a source terminal connected to an input terminal of the buffer;

a third NOR gate responsive to the clock signal and the write enable signal and connected to a gate terminal of the second transistor; and a second buffer responsive to a write data signal with an output connected to the drain terminal of the transmitting transistor.

9. The memory architecture of claim 8 wherein the second buffer comprises a latch.

10. A memory architecture comprising:

at least one memory cell mapped into a representative memory cell specifying physical and electrical characteristics of the at least one memory cell;

a word line block mapped into a representative word line block cell specifying physical and electrical characteristics of the word line block, the representative word line block further specifying the word line block being responsive to a write enable signal, a clock signal, and an address bus for applying a selection signal to the at least one memory cell, and the word line block forming the selection signal to select the at least one memory cell for data storage from the combination of the write enable signal, the clock signal, and an address signal, the address signal being derived from an address decoder coupled to the address bus;

a data block mapped into a representative data block cell specifying physical and electrical characteristics of the data block, the representative date block further specifying the data block being responsive to the write enable signal, the clock signal, and a data line, and the data block providing data to the at least one memory cell in synchronization with the memory cell receiving the selection signal from the word line block.

11. The memory architecture of claim 10 wherein the representative memory cell, the representative word line block cell, and the representative data block cell are added into a cell library for use with a synthesis tool and are represented by a hardware description language.

12. A method using a computer for designing an integrated circuit having a memory cell, a word line block, and a data block the integrated circuit being based on a high level language description describing the functions of the integrated circuit comprising:

generating a list including logic components and interconnections between the logic components from the high level language description, the list of logic components including the memory cell, a word line block, and a data block;

mapping the logic components to cells specifying electronic circuit components, including mapping the word line block to responsive to a write enable signal, and a clock signal, and an address decoder responsive to an address bus and apply a selection signal to the at least one memory cell and the data block to responsive to the write enable signal, the clock signal, and a data line for providing the data for storage by at least one memory cell wherein the clock signal of the word line block is proximate the output of the word line block and the clock signal of the data block is proximate the output of the data block; and providing the word line block, the data block, and the at least one memory cell for placement and routing by a place and route tool.

13. A method using a computer for designing an integrated circuit having a memory cell, a word line block, and a data block, the integrated circuit being based on a high level language description describing the functions of the integrated circuit, comprising:

generating a list, based on the high level language description, of logic components and interconnections between the logic components, the list of logic components including the memory cell, the word line block, and the data block;

mapping the logic components to cells specifying electronic circuit components, including mapping the word line block to circuitry containing word line block circuitry including write assertion circuitry responsive to a write enable signal and a clock signal, address decoder circuitry responsive to an address bus, and word line gating circuitry responsive to a write assertion circuitry output and an address decoder circuitry, the word line gating circuitry providing a word line signal output, and mapping the data block to data block circuitry including data signal gating circuitry responsive to the write enable signal, the clock signal, and a data in signal, the data signal gating circuitry providing a data signal; and automatically placing the electronic circuit components of the word line block, the data block, and the at least one memory cell in a circuit layout, the circuit layout being a volume formed by the integrated circuit occupies.

14. The method using a computer for designing an integrated circuit having a memory cell, a word line block, and a data block of claim 13 wherein the automatically placing the electronic circuit components of the word line block, the data block, and the at least one memory cell in a circuit layout is performed by a place and route tool.

15. The method of using a computer for designing an integrated circuit having a memory cell, a word line block, and a data block of claim 14 wherein the write assertion circuitry comprises a first and second NOR gate responsive to a write enable signal and a clock signal, an address decoder responsive to an address bus, and a NAND gate, a transistor, and an inverter that apply a selection signal to the memory cell, wherein the clock signal of the word line block is proximate the output of the word line block and the clock signal of the data block is proximate the output of the data block; and the data block circuitry comprises a third NOR gate responsive to the write enable signal and the clock signal, a transistor, and two buffers to provide data for storage by the memory cell, wherein the clock signal of the data block is proximate the output of the data block.

* * * * *

UNITED STATES PATENT AND TRADEMARK OFFICE
CERTIFICATE OF CORRECTION

PATENT NO. : 6,393,600 B1
DATED : May 21, 2002
INVENTOR(S) : Sarathy Sribhashyam et al.

It is certified that error appears in the above-identified patent and that said Letters Patent is hereby corrected as shown below:

Column 3,
Line 9, "requirements,." should be -- requirements, --

Column 4,
Line 44, "i" should be -- a --

Signed and Sealed this

Eleventh Day of March, 2003

JAMES E. ROGAN
*Director of the United States Patent and Trademark Office*